(12) United States Patent
Goto

(10) Patent No.: US 6,989,665 B2
(45) Date of Patent: Jan. 24, 2006

(54) ELECTRIC CURRENT DETECTOR WITH HALL EFFECT SENSOR

(75) Inventor: Hirokazu Goto, Niiza (JP)

(73) Assignee: Sanken Electric Co., Ltd., Saitama-pref. (JP)

( * ) Notice: Subject to any disclaimer, the term of this patent is extended or adjusted under 35 U.S.C. 154(b) by 118 days.

(21) Appl. No.: 10/691,303

(22) Filed: Oct. 21, 2003

(65) Prior Publication Data
US 2004/0080308 A1    Apr. 29, 2004

(30) Foreign Application Priority Data
Oct. 28, 2002    (JP)    ............................ P2002-312993

(51) Int. Cl.
*G01R 30/00* (2006.01)
(52) U.S. Cl. .................................. 324/117 H
(58) Field of Classification Search ............ 324/117 R, 324/117 H, 765, 158.1, 126, 127, 96; 338/32 R, 338/32 H, 49
See application file for complete search history.

(56) References Cited
U.S. PATENT DOCUMENTS

| | | | |
|---|---|---|---|
| 6,426,617 B1 * | 7/2002 | Haensgen et al. | 324/117 H |
| 6,515,468 B1 * | 2/2003 | Morimoto et al. | 324/117 H |
| 6,545,456 B1 * | 4/2003 | Radosevich et al. | 324/117 H |
| 6,781,359 B2 * | 8/2004 | Stauth et al. | 324/117 H |

* cited by examiner

*Primary Examiner*—Vinh Nguyen
*Assistant Examiner*—Tung X. Nguyen
(74) *Attorney, Agent, or Firm*—Bachman & LaPointe, P.C.

(57) ABSTRACT

An electric current detector is provided wherein loose arrangement of conductor 6 in opening 5 provides an air gap between the conductor 6 and plastic package 4 in opening 5 to prevent close contact of conductor 6 to plastic package 4. When heat and heat stress are produced in conductor 6 by a large electric current flowing through conductor 6 during measurement, air gap surely prevents heat and heat stress from traveling to Hall effect sensor 2 and plastic package 4 while a part of heat in conductor 6 is radiated into air in opening 5. Thus, the loose arrangement of conductor 6 can restrict or reduce deterioration of electric property in Hall sensor 2 and degradation of mechanical property in plastic package 4 by heat and heat stress in conductor 6. Also, the loose arrangement ensures and facilitates attachment of the detector 1 in position on a surface of a substrate, and enables to maintain conductor 6 at the same level as lead terminals 3 of the detector.

10 Claims, 6 Drawing Sheets

ELECTRIC CURRENT DETECTOR WITH HALL EFFECT SENSOR

TECHNICAL FIELD

The present invention relates to an electric current detector, in particular of the type provided with a Hall effect sensor for detecting an electric current flowing through a conductor in the detector while preventing deterioration of the Hall effect sensor.

BACKGROUND OF THE INVENTION

A device for detecting an electric current with a Hall effect sensor is known for example by Japanese Patent Disclosure No. 1-145837. The detecting device comprises a support pad, a plurality of lead terminals mounded around the support pad, a Hall effect sensor attached on a main surface of the support pad, wires for electrically connecting electrodes and lead terminals, and a plastic package for sealing the Hall effect sensor, wires, support pad and each inner end of the lead terminals. Flow of electric current through an object produces a magnetic field normal to the flowing direction of the electric current in the object, and placement of the detecting device in the magnetic field establishes a potential difference in the Hall effect sensor due to the Hall effect because the Hall effect sensor converts the magnetic field into electric voltage to detect or measure the current flow value. This potential difference is known as the Hall voltage perpendicular to the directions of the electric current and magnetic field, and the Hall voltage is proportional to the value of the detected electric current through the object.

Meanwhile, a current detector of another type has been proposed wherein a plastic package covers a Hall element positioned in a through hole formed in the package. This current detector includes a conductor inserted into the through hole to pass electric current through the conductor. Since the Hall element is disposed in the vicinity of the conductor, it can directly detect the current flow running through the conductor with good sensitivity. In this current detector, however, a problem arises that it requires troublesome and complicated assembling processes for inserting the conductor such as a wire into the through hole in the plastic package at a predetermined height, and thereby the assembling process impedes the changeover to automation of assembling process for the detectors. To overcome this problem, a new structure of the current detector has been developed as shown by "Alllegro Current Sensor, ACS750" presented by Allegro MicroSystems Inc., Worcester, Mass. (http://www.allegromicro.com/datafile/0750.pdf>). This detector utilizes an integrated packaging structure with a plastic package for encapsulating or molding a Hall effect sensor and a conductor into one piece to attain a stable current detection because the conductor provides a fixed current path relative to the Hall effect sensor in the package.

However, a large electric current flowing through the conductor heats the conductor to thereby cause heat and thermal stress exerted on the Hall effect sensor in the package so that there is a likelihood of deterioration of electric property in the Hall effect sensor and degradation of mechanical property in the plastic package. Also, the conductor requires its high machining accuracy enough to mount the current detector in position on a surface of a substrate keeping the conductor at a same level as lead terminals, thus lowering the productivity and yield.

Accordingly, an object of the present invention is to provide an electric current detector capable of restraining deterioration of electric property in a Hall effect sensor and degradation of mechanical property in a plastic package although a large electric current flowing through the conductor produces heat and heat stress in a conductor.

Also, another object of the present invention is to provide an electric current detector that can be mounted in position on a surface of a substrate with the conductor retained at the same level as lead terminals without high machining accuracy.

Still another object of the present invention is to provide an electric current detector capable of detecting a large electric current flowing through the conductor with high accuracy.

SUMMARY OF THE INVENTION

The electric current detector according to the present invention comprises a Hall effect sensor (2), a plurality of lead terminals (3) electrically connected to the Hall effect sensor (2), a plastic package (4) for encapsulating the Hall effect sensor (2) and each inner end of the lead terminals (3), and a conductor (6) loosely disposed with a gap in an opening (5) formed in the plastic package (4) and in spaced relation to the Hall effect sensor (2) to pass a detected electric current through the conductor (6). The loose arrangement of the conductor (6) provides the air gap or air layer between the conductor (6) and plastic package (4) in the opening (5) to prevent close contact between the conductor (6) and plastic package (4). Accordingly, heat and heat stress that may be produced in the conductor (6) by a large electric current flowing through the conductor (6) during measurement, are not transmitted to the Hall effect sensor (2) and plastic package (4) by the air gap while a part of heat in the conductor (6) is radiated into air in the opening (5). Therefore, the loose arrangement of the conductor (6) can restrict or reduce deterioration of electric property in the Hall sensor (2) and degradation of mechanical property in the plastic package (4) by heat and heat stress transmitted from the conductor (6) for conducting the large electric current. Moreover, the arrangement ensures and facilitates attachment of the detector in position on a surface of a substrate and enables to maintain the conductor (6) at the same level as lead terminals (3).

BRIEF DESCRIPTION OF THE DRAWINGS

The above-mentioned and other objects and advantages of the present invention will be apparent from the following description in connection with preferred embodiments shown in the accompanying drawings wherein.

BEST MODE FOR CARRYING OUT THE INVENTION

Figure 1:
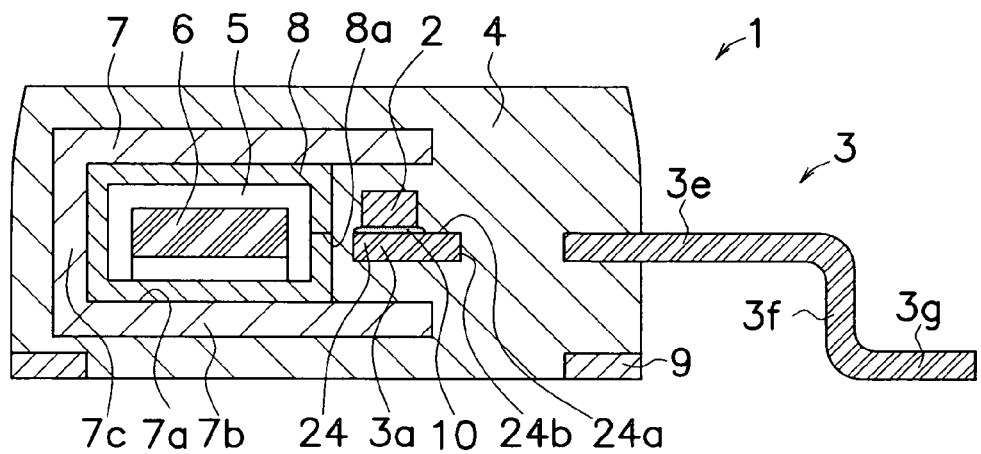
FIG. 1 is a sectional view showing an embodiment of the electric current detector according to the present invention.

As depicted in FIG. 1, an embodiment of the electric current detector 1 according to the present invention comprises a Hall effect sensor 2, a plurality of lead terminals 3 electrically connected to Hall effect sensor 2, a plastic package 4 for encapsulating Hall effect sensor 2 and each inner end of lead terminals 3, and a conductive member or conductor 6 loosely but irremovably disposed with a free gap in an opening 5 formed in the plastic package 4 and in spaced relation to Hall effect sensor 2. In this embodiment, the electric current detector 1 comprises a leadframe assembly 23 that includes a support pad 24, and three lead terminals 3 arranged at an outer edge 24 of support pad 24. Hall effect sensor 2 is secured on a main surface 24a of support pad 24 by an electric conductive adhesive or blazing metal such as solder 10.

Leadframe assembly 23 is formed by pressing a metallic plate such as cupper with the nickel-plated surfaces in a conventional manner. Central lead terminal 3b has forked inner ends connected to outer edge 24b of support pad 24, and remaining two lead terminals 3c, 3d are positioned in opposite sides of and in spaced relation to central lead terminal 3b. Hall effect sensor 2 has a plurality of electrodes (not shown) on upper surface 2a, and a plurality of wires or wire leads 11 electrically connect between electrodes of Hall effect sensor 2 and lead terminals 3c, 3d and between electrode of Hall effect sensor 2 and support pad 24. In this embodiment, leadframe assembly 23 has three lead terminals 3b, 3c, 3d, however, the number of lead terminals would be selected as required on how Hall effect sensor 2 is electrically connected to an external circuit not shown. As understood from FIG. 1, each of three lead terminals 3 comprises an inner portion 3e outwardly extending from package 4, an intermediate portion 3f bent and downwardly extending from inner portion 3e and an outer portion 3g further bent and extending from intermediate portion 3f in parallel to inner portion 3e for connection to any external circuit for measurement. For example, outer portions 3g are secured on a substrate by electrically conductive adhesive such as solder when electric current detector 1 is mounted on substrate. Description on well-known structure and preparation of Hall effect sensor 2 is herein omitted.

Figure 2:
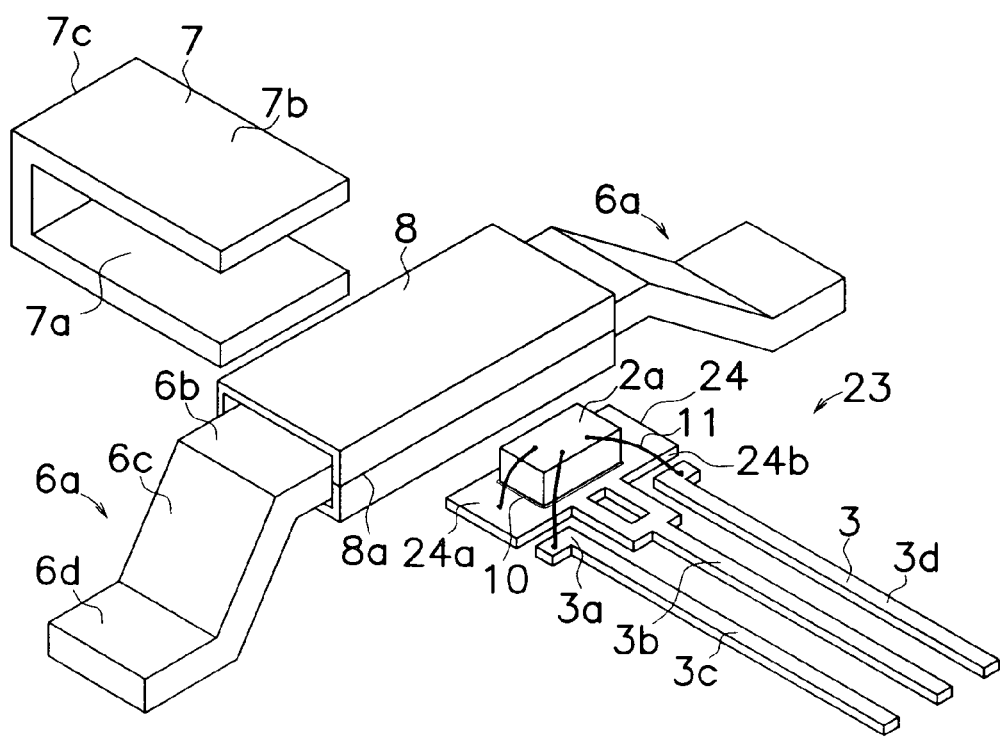
FIG. 2 is an exploded perspective view of the electric current detector before molding of a plastic package.
Figure 3:
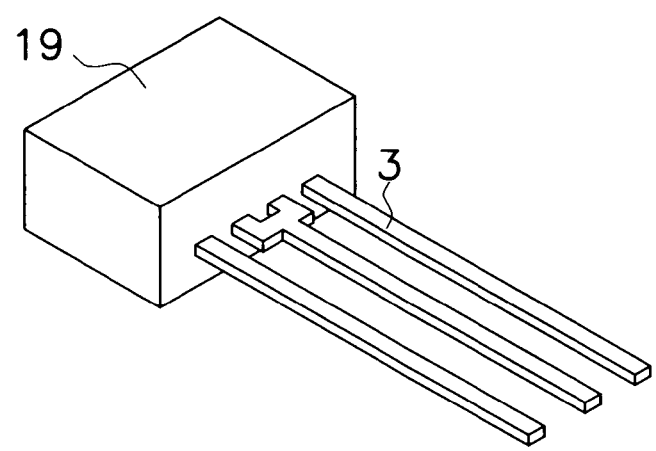
FIG. 3 is a perspective view of a Hall effect sensor encapsulated with resin.

FIGS. 1 and 2 represent plastic package 4 for directly encapsulating Hall effect sensor 2, support pad 24 and each inner end 3a of three lead terminals 3, but otherwise, as shown in FIG. 3, internal resin encapsulant or package 19 may be formed to previously encapsulate Hall effect sensor 2, support pad 24 and each inner end 3a of lead terminals 3 before molding or forming plastic package 4. Resin encapsulant 19 is effective to prevent damage to or cutoff of Hall effect sensor 2 or wires 11 by shock or impact from outside before forming plastic package 4. Different or same kind of resins may be used to plastic package 4 and resin encapslant 19. In any event, electric current detector 1 has a unitary packaged structure wherein package 4 envelops Hall effect sensor 2, core 7, reinforcement tube 8 and pads 9, and conductor 6 may be arranged in opening 5 of package 4 without contact of conductor 6 to inner surfaces of reinforcement tube 8.

Figure 4:
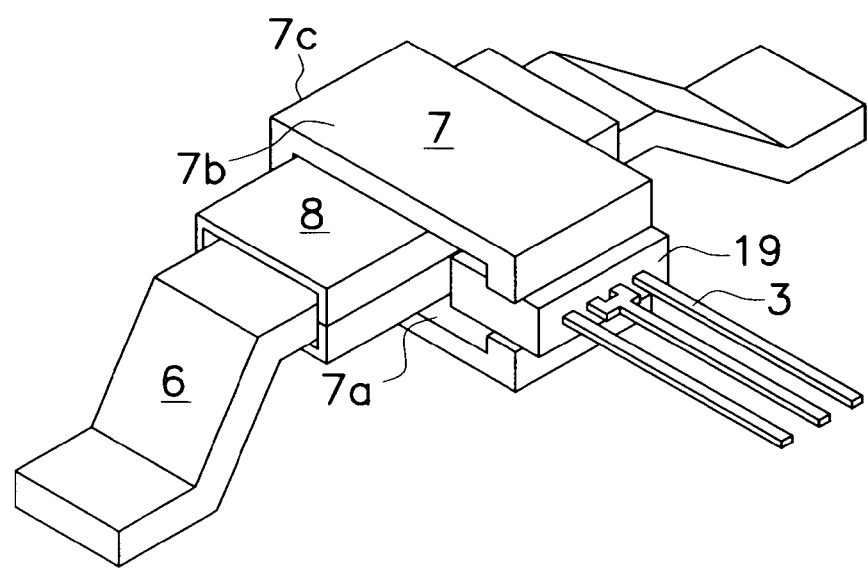
FIG. 4 is a perspective view showing an assembled structure of all components in the embodiment of the present invention before molding of the plastic package.

As illustrated in FIG. 1, the detector 1 comprises a core 7 formed of a magnetic material embedded in plastic package 4, and a reinforcement tube 8 of rectangular section to define an opening 5 inside reinforcement tube 8 and inside channel 7a of core 7. Core 7 may be formed of a magnetic material selected mainly from the group consisting of ferrite or mixture of resin and ferrite particles, iron, nickel, ferrosilicon, permalloy or other magnetic materials so that core 7 can effectively capture magnetic flux generated when conductor 6 conducts electric current to be detected by Hall effect sensor 2 with high sensitivity. Core 7 is formed into a U-shape or channel-shape that has a pair of upper and lower arm plates 7b opposite to each other and a connector 7c for connecting adjacent ends of arm plates 7b to define channel 7a inside core 7 so that channel 7a receives reinforcement tube 8 and leadframe assembly 23 of Hall effect sensor 2 and support pad 24, however, lead terminals 3 and outer edge 24b of support pad 24 are located out of cavity 7b. Core 7 can be formed into a clevis or as shown in FIG. 4, to have inward lugs extending toward Hall effect sensor 2 for forming a part of magnetic circuit at free ends of arm plates 7b and thereby sandwich resin encapsulant 19 or Hall effect sensor 2 between inward lugs. In other words, core 7 may be formed into one of any suitable or various shapes to form channel 7a for accommodating core 7 and Hall effect sensor 2.

Reinforcement tube 8 is embedded in package 4 to form opening 5 inside reinforcement tube 8 so that conductor 6 is loosely positioned in opening 5 with a free gap or clearance. In this arrangement, conductor 6 is inserted into opening 5 formed by reinforcement tube 8 made of copper material such as phosphor bronze to reduce impact upon conductor 6 by external noise such as change in electric field. Reinforcement tube 8 may be formed in various manners, for example by bending process of a coppery plate into a tubular shape or rectangular section with adhered, joined or welded longitudinal abutment 8a. Thickness of coppery material for making reinforcement tube 8 may be selected as required, however, thinner coppery material of reinforcement tube 8 is desirable to arrange conductor 6 in closer proximity of Hall effect sensor 2 for improvement of sensitivity in detecting electric current.

Figure 7:
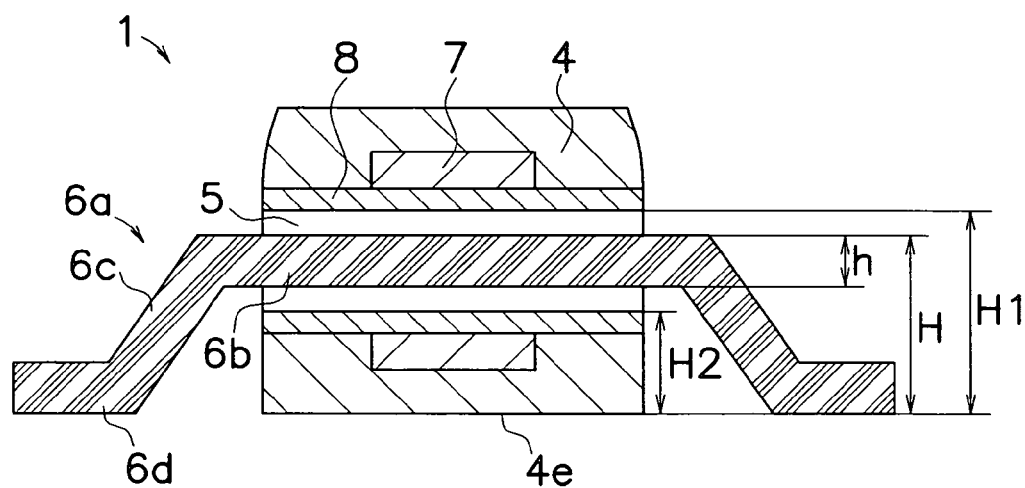
FIG. 7 is a sectional view taken along a longitudinal central line of the conductor.

Reinforcement tube 8 has the height substantially identical to or slightly smaller than height of channel 7a and the length substantially identical to width of package 4 as shown in FIG. 7 so that upper and bottom surfaces of reinforcement tube 8 are in close contact to inner surfaces of arm plates 7b. Package 4 covers upper and bottom surfaces of arm plates 7b, outer surface of connector 7c and a part of outer surfaces of reinforcement tube 8 that outwardly extends from arm plates 7b.

Hall effect sensor 2 or resin encapsulant 19 may be in contact to reinforcement tube 8. Inner surface of reinforcement tube 8 forms opening 5 and reinforcement tube 8 prevents exposure of package 4 in opening 5. As ferrite for forming core 7 is rather brittle and of lower mechanical strength, reinforcement tube 8 is mounted between conductor 6 and core 7 to protect core 7 against damage by contact to conductor 6 in opening 5. Not shown but an earth wire may be connected to reinforcement tube 8 to prevent electrification of conductor 6 by electrostatic induction in reinforcement tube 8.

Figure 5:
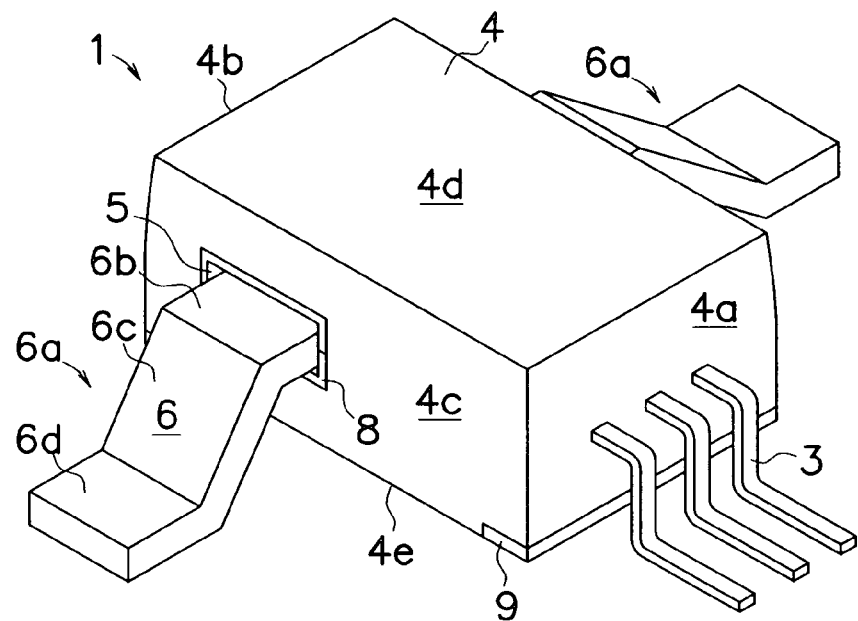
FIG. 5 is a perspective view of the electric current detector shown in FIG. 1.

Package 4 is made of a thermosetting resin such as epoxy resin into a rectangular parallelepiped that as shown in FIG. 5, includes a rectangular front and back surfaces 4a, 4b, a pair of side surfaces 4c, and top and bottom surfaces 4d, 4e. Three lead terminals 3 outwardly extend from front surfaces 4a, and opening 5 is formed between side surfaces 4c through package 4 to receive conductor 6 in opening 5.

Figure 6:
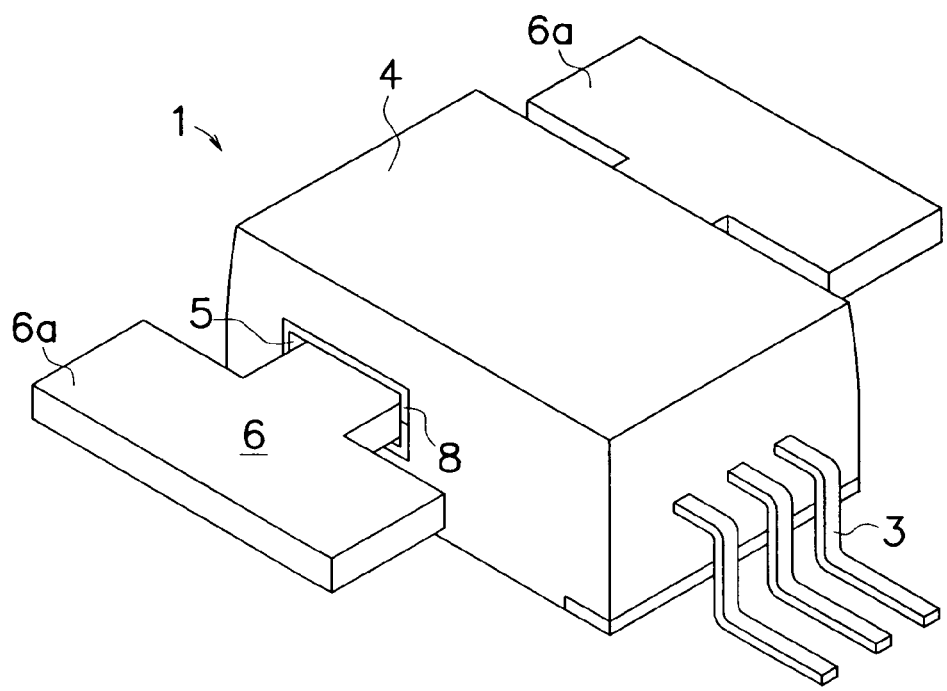
FIG. 6 is a perspective view of a second embodiment of the present invention with T-shaped ends formed with a conductor.

Conductor 6 is formed of a highly conductive metal for example copper or aluminum with nickel-plated surfaces into a generally trapezoid that includes a top beam 6b passing through opening 5 of package 4 and a pair of oblique legs 6a downwardly extending and diverging away from side surfaces 4c outside opening 5. Conductor 6 has the cross sectional area and surface area both greater than those of each lead terminal 3. Each leg 6a comprises an sloping strut 6c downwardly and diagonally extending from top beam 6b and a base 6d outwardly extending from bottom end of sloping strut 6c in parallel to top beam 6b. Each base 6d may be secured by solder on substrate for electric connection between conductor 6 and printed circuit on substrate for measurement. FIG. 5 simply shows an example of legs 6a that otherwise may be formed to have T-shaped ends as shown in FIG. 6. In other words, legs 6a may be formed into one of various shapes such as bent, curved, widened or enlarged configuration to prevent release or disengagement of conductor 6 from opening 5.

Top beam 6b is longer than length of opening 5 of package 4 to arrange legs 6a outside opening 5 away from side surface 4c of package 4. Accordingly, conductor 6 is movable in opening 5 in the longitudinal direction by an extended length of top beam 6b from opening 5. As shown in FIG. 7, H denotes a height from bottom surface of base 6d secured on substrate to top surface of top beam 6b of conductor 6, H1 denotes a height from bottom surface of package 4 to upper surface of opening 5, and H2 denotes a height from bottom surface of package 4 to bottom surface of opening 5. In this embodiment, H1 is greater than H that is greater than H2 (H2<H<H1). Thickness h of top beam 6b is smaller than height (H1−H2) of opening 5 [h<(H1−H2)] so that conductor 6 is movable in the vertical direction by a differential height (H1−H2−h) relative to package 4. Likewise, conductor 6 is larger than opening 5 in length to longitudinally move or adjust the position of conductor 6 in opening 5 by differential length of top beam 6b minus length of opening 5, and conductor 6 is smaller than opening 5 in thickness and width to vertically and widthwise move or adjust the position of conductor 6 by differential width and height of opening 5 minus top beam 6b. Thus, connective member 6 can be moved in opening 5 in the vertical, longitudinal and widthwise directions in the limited three directional ranges. Accordingly, these gaps ensure that conductor 6 is mounted in position on substrate in the condition of retaining conductor 6 at the same level as that of lead terminals 3 when electric current detector 1 is mounted on printed circuit board.

Electric current detector 1 further comprises pads 9 embedded in package 4 at the corners of front surface 4a and bottom surface 4e and of back surface 4b and bottom surface 4b. Each pad 9 is made of metal such as copper and has the bottom surface flush with or on the same plane as bottom surface of package 4 so that pads 9 are firmly secured by electrically conductive adhesive such as solder on printed circuits for stable and fixed attachment of electric current detector 1 on substrate.

Figure 8:
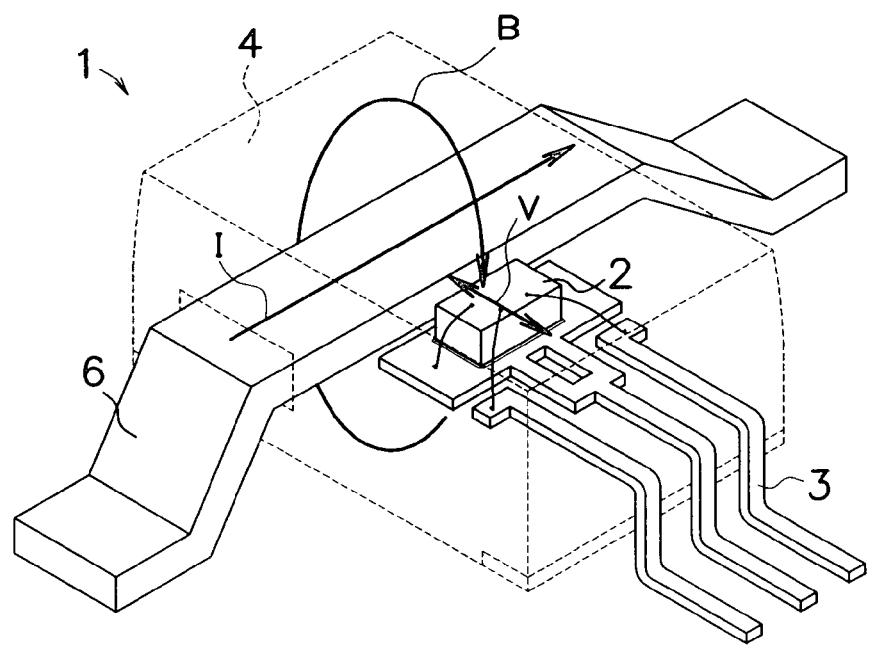
FIG. 8 is a perspective view indicating directions of current flow, magnetic field and Hall voltage generated in the electric current detector.

In detecting electric current flowing through an object, electric current detector 1 is mounted on substrate by bonding pads 9 on substrate by solder, and each outer portion 3g of lead terminals 3 is electrically connected to external circuit. Specifically, each base 6d of conductor 6 is connected to an electric measurement circuit to pass detected current flow across conductor 6. As shown in FIG. 8, when electric current I flows across conductor 6, magnetic field B perpendicular to the direction of electric current is induced as explained by Ampere's Right-Handed Screw Rule to produce magnetic flux passing through Hall effect sensor 2 adjacent to conductor 6. At the moment, core 7 forms a magnetic circuit for conducting the formed magnetic flux across Hall effect sensor 2. Accordingly, a potential difference V is established in Hall effect sensor 2 as Hall voltage perpendicular to the directions of electric current I and magnetic field B. Electric current can be detected or measured because Hall voltage is proportional to magnetic field B that is proportional to detected electric current.

For measurement of electric current, loose arrangement of the conductor 6 prevents close contact between the conductor 6 and plastic package 4 and may provide an air gap or air layer between conductor 6 and plastic package 4 in opening 5. Accordingly, when heat and heat stress are produced in conductor 6 by a large current flow through conductor 6 during measurement, air gap or air layer ensures prevention of heat and heat stress from traveling to Hall effect sensor 2 and plastic package 4 while a part of heat in the conductor 6 is radiated into air in opening 5. Therefore, loose arrangement of conductor 6 can restrict or reduce deterioration of electric property in Hall sensor 2 and degradation of mechanical property in plastic package 4 by heat and heat stress in conductor 6. Moreover, the arrangement ensures and facilitates attachment of the detector 1 in position on a surface of substrate and enables to maintain conductor 6 at the same level as lead terminals 3.

In fact, when a large electric current flows through conductor 6 for example on the order of 100 to 600 Amperes, conductor 6 is heated to produce in conductor 6 heat and heat stress that, however, are not transmitted to package 4 and Hall effect sensor 2 due to air gap in opening 5 between conductor 6 and package 4. Accordingly, electric current detector 1 can detect or measure aimed a large electric current without deterioration of electric property in Hall effect sensor 2 and degradation of mechanical property in package 4 by heat and heat stress.

Meanwhile, in electrically connecting base 6d of conductor 6 to an electric measurement circuit to detect current flow across conductor 6, solder is applied on substrate to mount electric current detector 1 on substrate via solder. In this condition, reflow soldering process is performed under heating to secure electric current detector 1 on substrate. Such a reflow soldering process or alternative welding process would heat and cool conductor 6 that gives rise to thermal deformation and stress transmitted to package 4 and Hall effect sensor 2 so that such thermal deformation and stress result in deterioration of Hall effect sensor 2 to cause damage to precise measurement of detected electric current. It should be noted that the structure according to the present invention can overcome such defect by the above reflow soldering or welding process due to the separated arrangement of conductor 6 and package 4.

Figure 9:
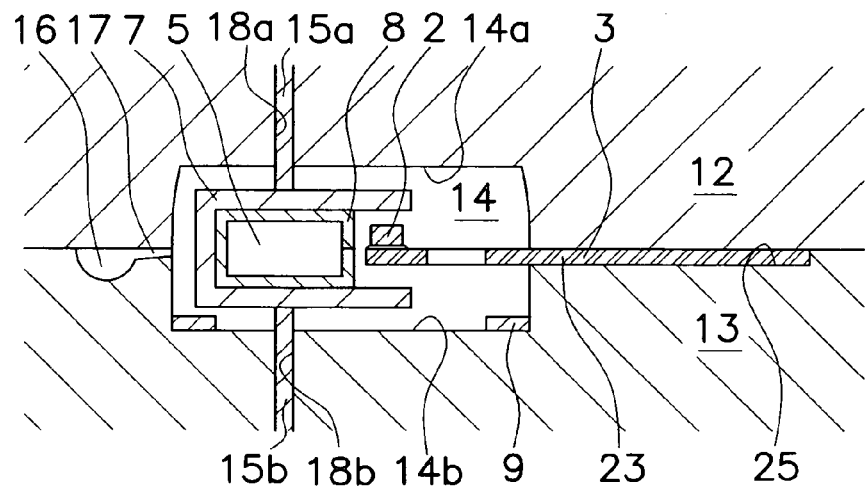
FIG. 9 is a sectional view of a forming mold for transfer molding with a pair of slidable pins.

In preparing electric current detector 1 according to the present invention, initially provided is a leadframe assembly 23 that has a support pad 24, lead terminals 3 and Hall effect sensor 2 mounted on support pad 24 by die bonding wherein wires 11 connect electrodes on Hall effect sensor 2 and lead terminals 3 by wire bonding. Then, leadframe assembly 23 is incorporated in cavity 14 of metallic mold that comprises upper mold half 12 and lower mold half 13, one is movable and the other is stationary. As shown in FIG. 9, cavity 14 has the shape complementary to package 4 upon clamping upper and lower mold halves 12, 13, and is communicated with runner 16 through gate 17. Lower mold half 13 is provided with a plurality of recesses 25 for receiving three lead terminals 3. Slidable pins 15a, 15b are fitted in corresponding bores 18a, 18b formed in alignment to each other in upper and lower mold halves 12, 13.

Metallic pads 9 are disposed at opposite corners of cavity bottom 14b. Reinforcement tube 8 is placed in channel 7a of core 7 that grips approximately central portion of reinforcement tube 8. In this case, no problem arises although resin penetrates into a clearance or gap between core 7 and reinforcement tube 8, however, longitudinal abutment 8a of reinforcement tube 8 is fully sealed to prevent inflow of resin into opening 5 inside reinforcement tube 8. Also, opposite ends of reinforcement tube 8 are in close contact to inner surfaces of cavity 14 to prevent permeation of resin into opening 5 through gaps between each end of reinforcement tube 8 and metallic mold. In this case, reinforcement tube 8 may be placed in the condition of longitudinal abutment 8a in contact to connector 7c of core 7 in front of gate 17.

In practice, leadframe assembly 23 is attached in cavity 14 and then core 7 and reinforcement tube 8 are located in cavity 14 to dispose Hall effect sensor 2 in channel 7a in face of reinforcement tube. Slidable pins 15a, 15b clamps arm plates 7b to set up core 7 and reinforcement tube 8 inside core 7 in position within cavity 14, and upper mold half 12 is placed on lower mold half 13 to close and clamp metallic mold and thereby define cavity 14 in metallic mold.

After that, fluidic resin is injected from runner 16 through gate 17 into cavity 14, and after fluidic resin is filled throughout cavity 14, slidable pins 15a, 15b are retracted into bores 18a, 18b, and fluidic resin is further poured under pressure to fill up cavity 14 and compensate any void therein. After curing or setting of resin in cavity 14, metallic mold is opened to remove the molded assembly.

Subsequently, lead terminals 3 of the molded assembly are bent as required to bring outer portions 3g into a same level as pads 9. Next, conductor 6 is inserted into opening 5 and legs 6a are bent to form sloping strut 6c and bases 6d to finish electric current detector 1 shown in FIG. 1. In the present invention, there is no need of difficult arrangement and precise forming of conductor 6 because conductor 6 is movable within opening 5 with gap to a necessary extent in vertical, longitudinal and widthwise directions to strictly align or adjust it on the same level as that of lead terminals 3.

Figure 10:
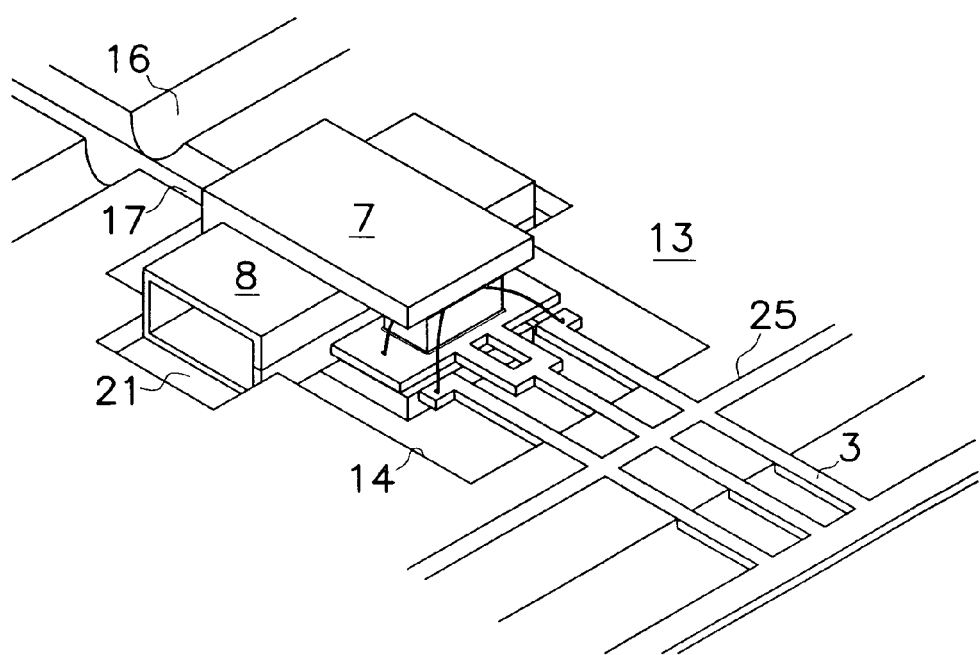
FIG. 10 is a perspective view of another forming mold of different type for transfer molding from that shown in FIG. 9.
Figure 11:
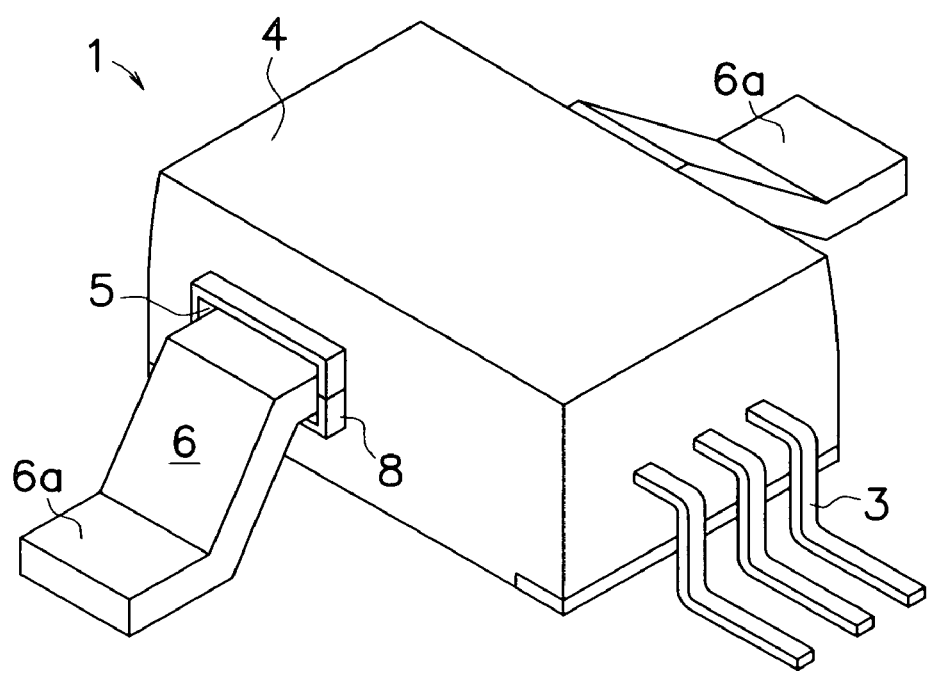
FIG. 11 is a perspective view of the electric current detector with a plastic package formed by the transfer molding shown in FIG. 10.

Without utilizing pins 15a, 15b shown in FIG. 9, other means can be used to retain core 7 and reinforcement tube 8 in position within cavity 14 during transfer molding. For example, as shown in FIG. 10, opposite ends of reinforcement tube 8 may be clamped between recesses 21 formed in upper and lower mold halves 12, 13 to keep arm plate 7b away from cavity bottom 14b and Hall effect sensor 2 between arm plates 7b adjacent to reinforcement tube 8. In this case, as shown in FIG. 11, opposite ends of reinforcement tube 8 are protruded from package 4 of finished electric current detector 1.

Otherwise, conductor 6 may previously be positioned in opening 5 to clamp opposite ends of conductor 6 between recesses 21 formed in upper and lower mold halves 12, 13 during transfer molding. Opening 5 may be formed by drilling or boring solid package 4 by any drill device or laser equipment. Package 4 may be formed by injection molding or pot type molding other than to use transfer molding. Reinforcement tube 8 may be of cylindrical shape.

Embodiments of electric current detector 1 according to the present invention produce the following functions and effects:

[1] Loose arrangement of conductor 6 in opening 5 with gap can restrict or reduce deterioration of electric property in Hall sensor 2 and degradation of mechanical property in plastic package 4 by heat and heat stress produced in conductor 6 upon passage of a large electric current through conductor 6 or upon attachment of conductor 6 on substrate by reflow or welding process.

[2] Productivity and yield of the detector 1 can be improved without need of its high machining accuracy of conductor.

[3] Metallic pads 9 ensure firm attachment of electric current detector 1 on substrate.

[4] Conductor 6 can easily be attached on surface of a substrate at the same level as lead terminals 3 or metallic pads 9 due to movement of conductor 6 in opening 5.

[5] Conductor 6 can be mounted in position on substrate due to the loose arrangement in opening 5.

[6] Conductor 6 does not require precise processing in forming or bending into a predetermined shape.

[7] Hall effect sensor 2 can detect electric current with high sensitivity because core 7 can effectively capture magnetic flux generated when electric current flows through conductor 6.

[8] Metallic reinforcement tube 8 can reduce impact upon conductor 6 by external noise such as change in electric field.

[9] Reinforcement tube 8 can protect core 7 from damage by contact to conductor 6.

[10] Legs 6a can be formed into a specific shape to prevent release or disengagement of conductor 6 from opening 5.

[11] Integrated structure by package 4 can realize stable detection of electric current by fixed arrangement of Hall effect sensor 2 and conductor 6.

[12] High sensitivity in detection can be attained by direct detection of electric current through conductor 6 adjacent to Hall effect sensor 2.

EXAMPLE

To confirm the effects obtained from the present invention, the electric current detector 1 was prepared and tested in the following procedure:

The electric current detector 1 was prepared that comprises Hall effect sensor 2, leadframe assembly 23 having three lead terminals 3, ferrite core 7, reinforcement tube 8, metallic pads 9 and package 4 formed with opening 5 for encapsulating these elements. Reinforcement tube 8 was made of phosphor bronze with the length of 2.7 millimeters. Conductor 6 was made of copper plate with nickeled surfaces with the top beam 6a of 0.8 millimeter in thickness.

When the resultant electric current detector 1 was mounted on a surface of substrate, top beam of conductor 6 could be mounted in position on the surface of substrate on the same level of conductor 6 as lead terminals 3 after conductor 6 was vertically and longitudinally moved in opening 5. In other words, an air-gap was formed between outer surfaces of conductor 6 and inner surfaces of opening 5 defined inside reinforcement tube 8. In fact, an electric current of 100 Amperes was passed through conductor 6, however, no problem arose regarding deterioration of electric property in Hall effect sensor 2 and degradation of mechanical property in package 4.

To measure intensity of magnetic field exerted on Hall effect sensor 2, electric current detector 1 was mounted on substrate with top beam 6b of conductor 6 supported approximately at the center of opening 5, and electric current was passed through conductor 6. As a result, intensity of magnetic field effected on Hall effect sensor 2 was $3.83e^{-4}$T. In contrast thereto, when electric current was passed through conductor 6 with top beam 6b of conductor 6 in close proximity to upper surface of opening 5, intensity of magnetic field affecting Hall effect sensor 2 was $3.79e^{-4}$T. Then, as a result of further several simulations and further tests performed, it has been found that variation in intensity of magnetic field sensed by Hall effect sensor 2 was very little on the order of 1% when conductor 6 was moved in opening 5 by 1 millimeter while detected electric current flowed through conductor 6. Accordingly, it also has been found that change in position of conductor 6 barely causes change in sensitivity by electric current detector 1.

What is claimed is:

1. An electric current detector comprising:
    a core formed of a magnetic material;
    a reinforcement tube disposed in said core for defining an opening inside said reinforcement tube;
    a Hall effect sensor disposed in said core out of said reinforcement tube;
    a plurality of lead terminals electrically connected to said Hall effect sensor;
    a plastic package for encapsulating said core, reinforcement tube, Hall effect sensor and each end of said lead terminals; and
    a conductor loosely and irremovably disposed in the opening of said reinforcement with a gap for longitudinal movement of said conductor in a limited range;
    said conductor being in spaced relation to said Hall effect sensor which detects electric current flowing through said conductor.

2. The electric current detector of claim 1, wherein said conductor is formed with a pair of legs that extend to the outside of said opening,
    each of said legs having a bent, curved or enlarged portion to prevent disengagement of said conductor from said opening.

3. The electric current detector of claim 1, wherein said conductor is larger than said opening in length but smaller than said opening in thickness and width to cause said conductor to vertically, longitudinally and widthwise move in said opening.

4. The electric current detector of claim 1, wherein said conductor comprises a pair of bases at the opposite ends to electrically connect said bases to printed circuits on substrate for detection of electric current through said conductor.

5. The electric current detector of claim 1, wherein said reinforcement tube of rectangular section is disposed in a channel formed by said core,
    said Hall effect sensor is positioned in said channel in front of said reinforcement tube.

6. The electric current detector of claim 1, wherein said conductor may be arranged in said opening without contact to inner surfaces of said reinforcement tube.

7. The electric current detector of claim 1, further comprising a support pad for mounting said Hall effect sensor on said support pad, wherein said support pad, Hall effect sensor (2) and lead terminals (3) form a leadframe assembly (23) for integral attachment in a cavity of a mold to form said package (4).

8. The electric current detector of claim 1, wherein said conductor forms a magnetic field of magnetic flux and said core forms a magnetic circuit through which said magnetic flux passes across said Hall effect sensor.

9. The electric current detector of claim 8, wherein said core comprises a pair of arm plates and a connector for connecting said arm plates to define a channel, said reinforcement tube is positioned in said channel to receive said conductor in said reinforcement tube.

10. The electric current detector of claim 9, wherein each of said arm plates has an inward lug at the free end extending toward said Hall effect sensor.

* * * * *